(12) United States Patent
Kim

(10) Patent No.: US 7,829,413 B2
(45) Date of Patent: Nov. 9, 2010

(54) METHODS FOR FORMING QUANTUM DOTS AND FORMING GATE USING THE QUANTUM DOTS

(75) Inventor: Jea Hee Kim, Yeoju-gun (KR)

(73) Assignee: Dongbu Hitek Co., Ltd., Seoul (KR)

( * ) Notice: Subject to any disclaimer, the term of this patent is extended or adjusted under 35 U.S.C. 154(b) by 181 days.

(21) Appl. No.: 12/163,859

(22) Filed: Jun. 27, 2008

(65) Prior Publication Data

US 2009/0170303 A1    Jul. 2, 2009

(30) Foreign Application Priority Data

Dec. 26, 2007   (KR) .................... 10-2007-0137081

(51) Int. Cl.
*H01L 21/336* (2006.01)
(52) U.S. Cl. .............. 438/263; 438/264; 438/752; 438/769; 257/E21.17; 257/E21.058; 257/E21.259; 257/E21.267; 257/E21.278; 257/E21.293; 257/E21.422

(58) Field of Classification Search ............ 438/263, 438/264, 257, 663, 679, 769, 752, 954; 257/E21.058, 257/E21.231, E21.259, E21.267, E21.278, 257/E21.293, E21.422
See application file for complete search history.

(56) References Cited

U.S. PATENT DOCUMENTS 7,195,872 B2 *   3/2007   Agrawal et al. ............. 435/6
2003/0148401 A1 *   8/2003   Agrawal et al. ............ 435/7.9

* cited by examiner

*Primary Examiner*—David Nhu
(74) *Attorney, Agent, or Firm*—Workman Nydegger

(57) ABSTRACT

Methods for forming a gate using quantum dots are disclosed. More particularly, the present invention relates to a method for forming quantum dots for fabrication of an ultrafine semiconductor device includes a gate with quantum dots. The present invention is capable of forming quantum dots in uniform sizes and at uniform intervals so as to achieve an electrically stable device.

19 Claims, 2 Drawing Sheets

METHODS FOR FORMING QUANTUM DOTS AND FORMING GATE USING THE QUANTUM DOTS

CROSS-REFERENCE TO RELATED APPLICATIONS

This application claims the benefit of the Korean Patent Application No. 10-2007-0137081, filed on Dec. 26, 2007, which is hereby incorporated by reference as if fully set forth herein.

BACKGROUND OF THE INVENTION

1. Field of the Invention

The present invention relates to semiconductor technology. More particularly, the present invention relates to a method for forming quantum dots for fabricating of an ultrafine semiconductor device and a method for forming a gate using the quantum dots.

2. The Related Art

Along with the development of semiconductor devices that have both high-speed operation and increased mass storage capabilities, fabrication technologies have been developing in order to create semiconductor devices with improved integrity, reliability, and a response speed.

One example of a general semiconductor device is flash memory, which is comprised of a general gate comprising a tunneling dielectric layer formed on a substrate of the semiconductor device, a floating gate formed on the tunneling dielectric layer, an oxide-nitride-oxide (ONO) layer formed on the floating gate, and a control gate formed on the ONO layer. In the devices currently known in the art, the minimum vertical thickness of the general gate is limited, making it difficult to forming a channel in the above-structured general gate. Unfortunately, this limitation hinders integrity of the device. Moreover, the thickness requirements of the general gate structure cannot be applied to an embedded-type flash memory.

In order to alleviate these difficulties, silicon (Si) quantum dots have recently been suggested as a substitute for the floating gate. For example, FIG. 1 is a sectional view showing the structure of a general conventional gate currently known in the art which includes quantum dots. Referring to FIG. 1, an isolation layer 2 is formed on a semiconductor substrate 1 in order to define an active region and an inactive region of the semiconductor substrate 1. Next, an oxide is vapor-deposited on the whole surface of the semiconductor substrate 1, thereby forming a first gate dielectric layer 3, or tunneling dielectric layer. A second gate dielectric layer 4 is formed by vapor-depositing a nitride such as SiON onto the first gate dielectric layer 3. The second gate dielectric layer 4 includes an excess of Si atoms which easily bond with oxygen atoms in order to form a Si—O configuration. The second gate dielectric layer 4 is formed to be thicker than the layer which includes the quantum dots formed in a subsequent process.

In addition, a conductive metal layer (not shown) is deposited on the second gate and a thermal treatment is performed on the conductive metal layer. As a result of the thermal treatment, the Si atoms of the second gate dielectric layer 4 and metal atoms of the conductive metal layer (not shown) are moved close to each other, thereby forming quantum dots 6 on the second gate dielectric layer 4. Then, the conductive metal layer (not shown) is removed, and a gate electrode material 5 is deposited on the second gate dielectric 4 layer which includes the quantum dots 6.

Then, a gate pattern is formed by performing an etching process, and a source and a drain are formed at a lower part of the semiconductor substrate 1 at a location adjoining the gate. Thus, structuring of the gate of the semiconductor device is completed.

Moreover, although not described above, according to the conventional method, the dielectric layer having the quantum dots is insulated by a dielectric material, such as an oxide or nitride, and then a gate poly for a control gate is vapor-deposited.

In such structures, the quantum dots need to be formed in uniform sizes and at uniform intervals. This is difficult to do, however, since the conventional methods typically form the quantum dots by vapor-depositing an amorphous poly and using agglomeration by the thermal treatment process, making it difficult to achieve uniform intervals between the quantum dots.

BRIEF SUMMARY OF THE INVENTION

Accordingly, the present invention is directed to methods for forming quantum dots and forming a gate using the quantum dots that substantially obviates one or more problems, limitations, or disadvantages of the related art.

An object of the present invention is to provide a method for forming a gate including quantum dots which are formed at uniform intervals an uniform shapes in order to achieve an electrically stable device.

To achieve these objects and other advantages and in accordance with the purpose of the invention, one aspect of the present invention is a method for forming a gate including quantum dots. The method comprises forming a photoresist pattern on a surface of a wafer, forming a plurality of micro pits at uniform intervals on the wafer surface by performing an etching process using the photoresist pattern, forming a Si dielectric layer on the surface of the wafer formed with the micro pits, depositing a conductive metal layer on the Si dielectric layer and performing a thermal treatment on the conductive metal layer, forming quantum dots by arranging metal atoms of the conductive metal layer at positions on the Si dielectric layer that correspond to the micro pits, removing the conductive metal layer from the Si dielectric layer formed with the quantum dots, forming a dielectric layer on the Si dielectric layer, and forming a gate poly on the dielectric layer.

Another aspect of the present invention is a method for forming a gate using quantum dots comprising forming a photoresist pattern on a wafer surface in a cell area, forming a plurality of micro pits at uniform intervals on the wafer surface by performing an etching process using the photoresist pattern, forming a first dielectric layer on the surface of the wafer formed with the micro pits, depositing a Si-based second dielectric layer on the first dielectric layer, depositing a conductive metal layer on the second dielectric layer and performing a thermal treatment on the conductive metal layer, forming quantum dots by arranging metal atoms of the conductive metal layer at positions on the second dielectric layer that correspond to the micro pits, removing the conductive metal layer from the second dielectric layer formed with the quantum dots, forming a dielectric layer on the second dielectric layer, and forming a gate poly on the dielectric layer.

Yet another aspect of the present invention is a method for forming a gate using a plurality of quantum dots comprising forming a first dielectric layer on a wafer surface in a cell area, forming a photoresist pattern on the first dielectric layer, forming a plurality of micro pits at uniform intervals on the first dielectric layer by performing etching process using the photoresist pattern, forming a seed Si layer on a surface of the first dielectric layer formed with the micro pits, depositing a conductive metal layer on the seed Si layer and performing a thermal treatment on the conductive metal layer, forming quantum dots by arranging metal atoms of the conductive metal layer at positions on the seed Si layer that correspond to the micro pits, removing the conductive metal layer from the seed Si layer formed with the quantum dots, forming a dielectric layer on the seed Si layer, and forming a gate poly on the dielectric layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application. The drawings illustrate embodiment(s) of the invention and along with the description serve to explain the principle of the invention. In the drawings.

DETAILED DESCRIPTION OF THE INVENTION

Additional objects, features and advantages will become apparent from the following detailed description of preferred embodiments taken in conjunction with the accompanying drawings.

Reference will now be made to the structure and the operation of the preferred embodiments of the present invention. In addition, it is to be clearly understood that the structure and the operation in this description are made only by way of example and not as a limitation to the scope of our invention.

Hereinafter, methods for forming quantum dots and for forming a gate using the quantum dots according to the embodiments of the present invention will be described in detail with reference to the accompanying drawings.

Figure 1:
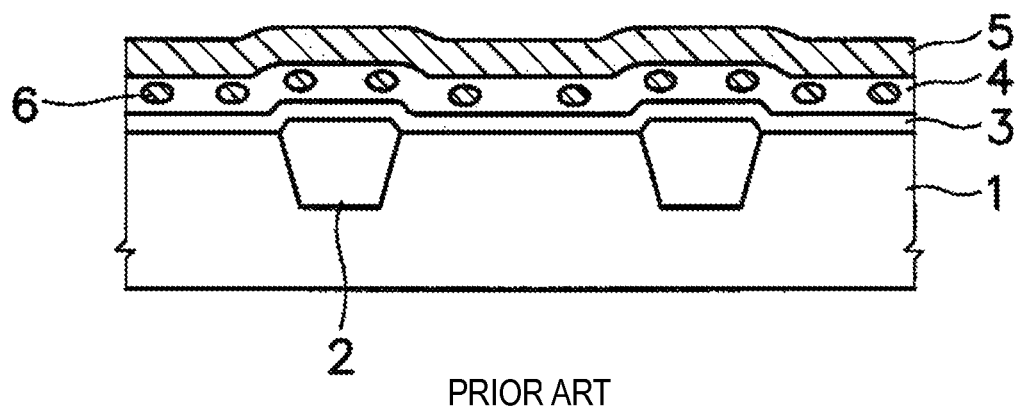
FIG. 1 is a sectional view showing the structure of a conventional gate applying quantum dots.
Figure 2:
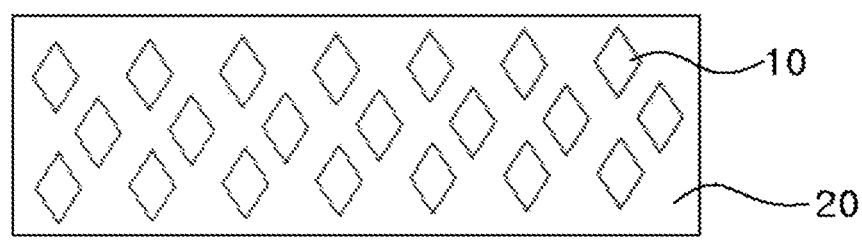
FIG. 2 shows a photoresist pattern used in producing a pit for forming the quantum dots, according to an embodiment of the present invention.

First, an isolation layer is formed on a wafer so as to define a cell area. Then, as shown in FIG. 2, a photoresist pattern 20 is formed with a pattern designed to form micro pits at uniform intervals on a surface of the wafer. FIG. 2 shows the photoresist pattern used to produce the pits for forming the quantum dots, according to an embodiment of the present invention. The photoresist pattern 20 includes a plurality of openings for exposing the surface of the wafer at uniform intervals, so as to form pit patterns which are distributed at uniform intervals.

In one example, which is shown in FIG. 2, the open patterns may comprise open areas 10 having diamond shapes which are arranged at uniform intervals through the wafer surface.

Figure 3:
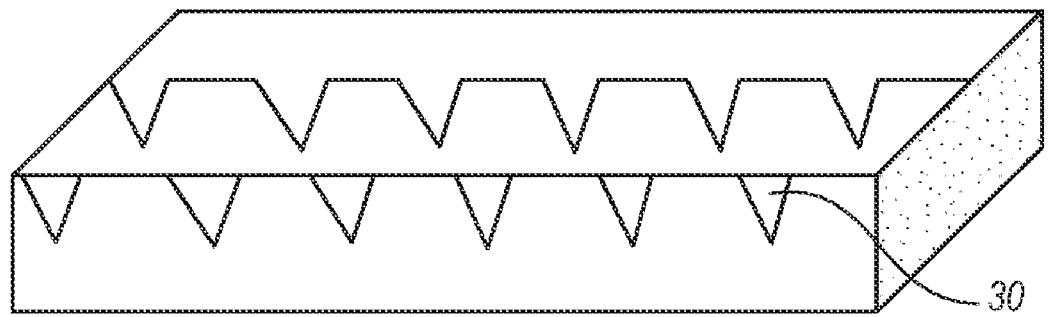
FIG. 3 shows a wafer surface after being etched according to the pattern of FIG. 2 according to an embodiment of the present invention.

Next, an etching process is performed using the photoresist pattern in order to produce a plurality of micro pits 30 which are distributed at uniform intervals on the wafer surface as shown in FIG. 3. More specifically, in one embodiment, a Secco etching may be performed in order to form the micro pits 30. In such embodiments, a Secco etchant, such as a compound solution containing KOH, NaOH, or the like may be used as the etchant. Therefore, the micro pits 20 are formed in the cell area of the wafer or on the layers on the wafer. In the preferred embodiment using the Secco etchant, the etchant produces the patterns for the micro pits 30 through a crystallization process.

FIG. 3 shows the surface of the wafer after being etched using the patterns of FIG. 2. Here, the size of the micro pits 30, have a width that is equal to or less than 10 nm and a depth is equal to or less than 10 nm. In this embodiment, conditions including the etching temperature and time are adjusted so that both the width and depth of the pits 30 are less than or equal to 10 nm. However, the conditions are not limited to certain numerical values and therefore, explanation about specific examples will be omitted herein.

Next, a silicon (Si) dielectric layer, onto which the quantum dots will be formed, is formed on the wafer having the micro pits 30, as shown in FIG. 3.

Figure 4:
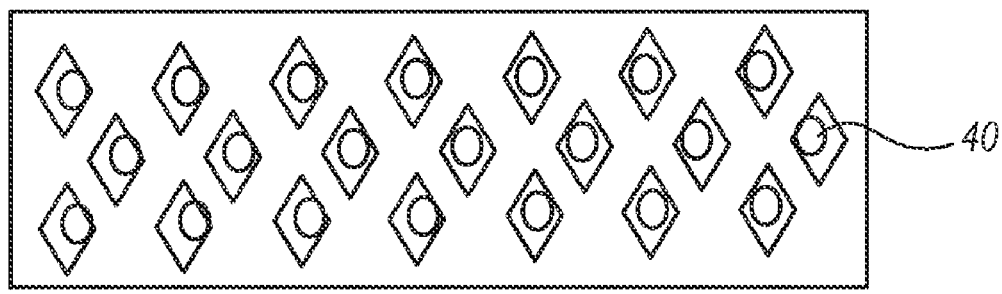
FIG. 4 shows the quantum dots being formed on a micro pit area according to the embodiment of the present invention.

A conductive metal layer is deposited on the Si dielectric layer, and a thermal treatment is performed on the wafer. During this process, the Si atoms of the Si dielectric layer and metal atoms of the conductive metal layer are moved relative to each other, causing a plurality of quantum dots 40 to be formed on the Si dielectric layer. More specifically, the metal atoms of the conductive metal layer are implanted in positions on the Si dielectric layer that correspond to the positions of the micro pits 30 formed on the wafer surface. Accordingly, the plurality of quantum dots 40 are formed as shown in FIG. 4.

Then, the conductive metal layer is removed from the Si dielectric layer formed with the quantum dots 40.

Then, the Si dielectric layer with the quantum dots is insulated using a dielectric material such as an oxide or a nitride. Then, a control gate is formed on the dielectric material in order to form a gate with the quantum dots 40.

Although the micro pits 40 are formed on the wafer surface in the above description, the present invention is not limited to this structure. Therefore, the micro pits may be formed on other layers so that the quantum dots can be formed on other various layers.

For example, a dielectric layer such as a tunneling oxide layer may be first vapor-deposited on the surface of the wafer, and the photoresist pattern as shown in FIG. 2 may be formed on the surface of the dielectric layer such that the micro pits are formed on the surface of the dielectric layer in accordance with the photoresist pattern.

According to another example, the micro pits are formed on the wafer surface and a dielectric layer such as a tunneling oxide layer is vapor-deposited on the wafer having the micro pits formed thereon. Then, the Si dielectric layer for forming the quantum dots may be formed on the dielectric layer.

Hereinafter, an method of forming the quantum dots on a floating gate will be described in greater detail.

First, an isolation layer for defining the cell area is formed on the wafer. Then, a photoresist pattern, such as the pattern shown in FIG. 2, is formed on the surface of the wafer within the cell area so as to form the micro pits at uniform intervals. Then, an etching process is performed using the photoresist pattern in order to form the micro pits distributed on the wafer surface at uniform intervals. Then, a tunneling dielectric layer is formed by vapor-depositing an oxide on the wafer formed with the micro pits.

After that, a Si-based floating gate is formed by vapor-depositing a Si oxide or nitride, such as SiON, on the tunneling dielectric layer and a conductive metal layer is deposited on the floating gate.

Then, if the thermal treatment is performed with respect to the wafer, the Si atoms of the floating gate and the metal atoms of the conductive metal layer are moved relative to each other. More particularly, the metal atoms of the conductive metal layer are implanted in the floating gate, and the implanted metal atoms are arranged on the floating gate at positions that correspond to the micro pits on the wafer. As a consequence, the quantum dots are formed on the floating gate to correspond to the micro pits.

As shown in FIG. 4, all the quantum dots are arranged within areas of the micro pits because the stress is greatest within the micro pits and therefore an agglomeration occurs at positions corresponding to the micro pits. FIG. 4 shows the state where the quantum dots are formed in the areas of the micro pits.

Next, the conductive metal layer is removed from the floating gate formed with the quantum dots. Then, after the quantum dots are formed on the floating gate as described above, the floating gate is insulated by vapor-depositing an oxide or a nitride on the floating gate in order to make the other gate structures. Afterward, a gate poly for the control gate is vapor-deposited, thereby completing the gate structure applying the quantum dots.

Hereinafter, another example for forming the quantum dots will be described in detail. First, an isolation layer for defining the cell area is formed on the wafer. Next, a tunneling dielectric layer is formed by vapor-depositing an oxide on the wafer. Then, a photoresist pattern, such as the pattern shown in FIG. 2, is formed on the surface of the tunneling dielectric layer in the cell area so as to form the micro pits at uniform intervals. Then, an etching process is performed using the photoresist pattern in order to form a plurality of micro pits which are distributed on the surface of the tunneling dielectric layer at uniform intervals, such at the intervals shown in FIG. 3. Then, an amorphous seed Si layer is vapor-deposited on the tunneling dielectric layer having the micro pits formed thereon. Here, the seed Si layer is formed at the processing temperature of about 470-530 degrees Fahrenheit to have at most a 20 nm thickness.

Alternatively, an oxide layer may be vapor-deposited on the seed Si layer before the conductive metal layer is deposited.

Meanwhile, a the conductive metal layer, such as phosphorus (P), is deposited on the seed Si layer, an a thermal treatment is performed under $N_2$ atmosphere. Especially, the thermal treatment is performed so that P atoms are implanted in the seed Si layer in a predetermined period of time in accordance with input pulses. According to this, more efficient charge trap can be achieved.

During the thermal treatment, the Si atoms of the seed Si layer and the P atoms of the conductive metal layer are moved relative to each other. More specifically, the conductive metal, which may comprise a plurality of P atoms, are implanted in the seed Si layer and arranged at positions on the seed Si layer that correspond to the micro pits of the tunneling oxide layer.

Therefore, the quantum dots are formed on the positions of the seed Si layer that correspond to the micro pits.

As shown in FIG. 4, all the quantum dots are arranged within areas of the micro pits because the stress is greatest in the micro pits and therefore the agglomeration of conductive material occurs at positions corresponding to the micro pits. FIG. 4 shows the state where the quantum dots are formed in the areas of the micro pits.

Next, the conductive metal layer is removed from the seed Si layer, and the seed Si layer with the quantum dots is insulated by vapor-depositing an oxide or a nitride on the seed Si layer in order to form the other gate structures. Afterward, a gate poly is vapor-deposited, thereby completing the gate structure applying the quantum dots.

As apparent from the above description, and in accordance with the embodiments of the present invention, an electrically stable device can be achieved since the Si quantum dots are formed in uniform intervals and uniform sizes, thereby guaranteeing reliability of the device.

Although embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method for forming a gate with quantum dots comprising:
   forming a photoresist pattern on a surface of a wafer in order to form a plurality of micro pits;
   etching the photoresist pattern in order to form a plurality of micro pits at uniform intervals;
   forming a Si dielectric layer on the surface of the wafer with the micro pits;
   depositing a conductive metal layer on the Si dielectric layer and performing a thermal treatment on the conductive metal layer and Si dielectric layer;
   forming quantum dots in the Si dielectric layer by arranging metal atoms of the conductive metal layer at positions on the Si dielectric layer that correspond to the micro pits;
   removing the conductive metal layer from the Si dielectric layer with the quantum dots;
   forming a dielectric layer on the Si dielectric layer formed with the quantum dots; and
   forming a gate poly on the dielectric layer.

2. The method for forming a gate with quantum dots according to claim 1, wherein the micro pits are formed so that both the width and depth or the micro pits are less than or equal to 10 nm.

3. The method for forming a gate with quantum dots according to claim 1, wherein a tunneling oxide layer is deposited on the wafer surface and the photoresist pattern is formed on the tunneling oxide layer.

4. The method for forming a gate with quantum dots according to claim 1, wherein the photoresist pattern comprises open areas having a diamond shape which are arranged at uniform intervals through the whole wafer surface such that the micro pits arc distributed at uniform intervals.

5. The method for forming a gate with quantum dots according to claim 1, wherein the etching process comprises using a KOH or NaOH etchant on the photoresist pattern.

6. The method for forming a gate with quantum dots according to claim 1, wherein the dielectric layer formed on the Si dielectric layer comprises a oxide or nitride layer.

7. A method for forming a gate with quantum dots comprising:

forming a photoresist pattern on a surface of a wafer in a cell area to form micro pits at uniform intervals;

etching using the photoresist pattern in order to form a plurality of micro pits at uniform intervals on the r surface of the wafer;

forming a first dielectric layer on the surface of the wafer formed with the micro pits;

depositing a Si-based second dielectric layer on the first dielectric layer;

depositing a conductive metal layer on the Si-based second dielectric layer and performing a thermal treatment on the conductive metal layer;

arranging the metal atoms of the conductive metal layer at positions on the Si-based second dielectric layer corresponding to the micro pits in order to form quantum dots;

removing the conductive metal layer from the second dielectric layer formed with the quantum dots;

forming a dielectric layer on the Si-based second dielectric layer formed with the quantum dots; and forming a gate poly on the dielectric layer.

8. The method for forming a gate with quantum dots according to claim 7, wherein forming the first dielectric layer on the surface of the wafer formed with the micro pits comprises vapor depositing an oxide onto the surface of the wafer.

9. The method for forming a gate with quantum dots according to claim 7, wherein the etching process comprises using a KOH or NaOH etchant on the photoresist pattern.

10. The method for forming a gate with quantum dots according to claim 7, wherein the dielectric layer formed on the Si-based second dielectric layer comprises a oxide or nitride layer.

11. The method for forming a gate with quantum dots according to claim 7, wherein the Si-based second dielectric layer is formed by forming a amorphous seed Si-layer with a thickness of about 20 nm at a temperature between 470 and 530 degrees Fahrenheit.

12. The method for forming a gate with quantum dots according to claim 7, wherein the micro pits are formed so that both the width and depth of the micro pits are less than or equal to 10 nm.

13. The method for forming a gate with quantum dots according to claim 7, wherein the photoresist pattern comprises a plurality of open areas having diamond shapes which are arranged at uniform intervals on the wafer surface such that the micro pits are formed at uniform intervals.

14. A method for forming a gate with quantum dots comprising:

forming a first dielectric layer on a surface of a wafer in a cell area ;

forming a photoresist pattern on the first dielectric layer in order to form a plurality of micro pits at uniform intervals;

performing an etching process on the first dielectric layer using the photoresist pattern in order to form a plurality of micro pits on the first dielectric layer at uniform intervals;

forming a seed Si layer on a surface of the first dielectric layer with the micro pits;

depositing a conductive metal layer on the seed Si layer and performing a thermal treatment on the conductive metal layer;

forming quantum dots by arranging metal atoms of the conductive metal layer at positions on the seed Si layer which correspond to the micro pits;

removing the conductive metal layer from the seed Si layer formed with the quantum dots;

forming a dielectric layer on the seed Si layer formed with the quantum dots; and forming a gate poly on the dielectric layer.

15. The method for forming a gate with quantum dots according to claim 14, wherein the photoresist pattern comprises a plurality of open areas having diamond shapes which are arranged at uniform intervals on the wafer surface.

16. A method for forming a gate with quantum dots according to claim 14, wherein the micro pits are formed so that both the width and depth are less than or equal to 10 nm.

17. The method for forming a gate with quantum dots according to claim 14, wherein the etching process comprises using a KOH or NaOH etchant on the photoresist pattern.

18. The method for forming a gate with quantum dots according to claim 14, wherein forming the first dielectric layer on the surface of the wafer comprises vapor depositing an oxide onto the wafer surface.

19. The method for forming a gate with quantum dots according to claim 14, wherein the Si-based second dielectric layer is formed by forming an amorphous seed Si-layer with a thickness of about 20 nm at a temperature between 470 and 530 degrees Fahrenheit.

* * * * *